(12) United States Patent
Wu

(10) Patent No.: US 8,853,848 B2
(45) Date of Patent: Oct. 7, 2014

(54) INTERCONNECTION STRUCTURE, APPARATUS THEREWITH, CIRCUIT STRUCTURE THEREWITH

(75) Inventor: Shih-Hsien Wu, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 247 days.

(21) Appl. No.: 13/109,016

(22) Filed: May 17, 2011

(65) Prior Publication Data

US 2012/0187550 A1 Jul. 26, 2012

(30) Foreign Application Priority Data

Jan. 24, 2011 (TW) .............................. 100102523 A

(51) Int. Cl.
| | | |
|---|---|---|
| H01L 23/48 | (2006.01) | |
| H01L 23/14 | (2006.01) | |
| H05K 1/02 | (2006.01) | |
| H01L 21/768 | (2006.01) | |
| H01L 21/48 | (2006.01) | |
| H01L 23/498 | (2006.01) | |

(52) U.S. Cl.
CPC ........ *H05K 1/0222* (2013.01); *H05K 2201/096* (2013.01); *H01L 23/147* (2013.01); *H01L 21/76898* (2013.01); *H01L 21/486* (2013.01); *H01L 23/49827* (2013.01); *H01L 2924/0002* (2013.01)
USPC ..................... 257/690; 257/692; 257/E31.122

(58) Field of Classification Search
CPC . H01L 23/147; H01L 23/49827; H01L 23/48; H01L 23/552; H01L 21/76898
USPC ............. 174/255; 333/33, 246; 257/275, 690, 257/692, 659, 664, 259, 442, 508, 660, 669, 257/9, 662, 208, E31.122, E29.282
See application file for complete search history.

(56) References Cited

U.S. PATENT DOCUMENTS

| 4,571,654 A | 2/1986 | Oishi |
| 4,622,527 A | 11/1986 | Carlson |

(Continued)

FOREIGN PATENT DOCUMENTS

| TW | M308600 | 3/2007 |
| TW | 200926521 | 6/2009 |

OTHER PUBLICATIONS

Montrose et al., "Radiated Emission Far-Field Propagation with Multiple Ground Stitch Locations Within a Printed Circuit Board", 2010 Asia-Pacific International Symposium on Electromagnetic Compatibility, Apr. 12-16, 2010, p. 297-p. 300.

(Continued)

*Primary Examiner* — Cuong Q Nguyen
*Assistant Examiner* — Yosef Gebreyesus
(74) *Attorney, Agent, or Firm* — Finnegan, Henderson, Farabow, Garrett & Dunner LLP

(57) ABSTRACT

An interconnection structure is disposed between a first conductive layer and a second conductive layer substantially parallel to each other. The conductive layer includes a signal trace. The interconnection structure includes a conductor pillar and a shielding wall pillar. The conductor pillar goes through between the two conductive layers and is electrically connected to the signal trace of the first conductive layer. The shielding wall pillar is also disposed between the two conductive layers and located at a portion of an external region surrounding the conductor pillar and electrically coupled to the conductor pillar. The conductor pillar and the shielding wall pillar are disposed in pair or in group. The shielding wall pillar with a shape different from that of the conductor pillar would make the conductor pillar serve as a connection with a designed impedance and the capability of controlling impedance based on the special shape design thereof.

25 Claims, 20 Drawing Sheets

(56) References Cited

U.S. PATENT DOCUMENTS

| | | | |
|---|---|---|---|
| 5,451,720 A | 9/1995 | Estes et al. | |
| 5,481,795 A | 1/1996 | Hatakeyama et al. | |
| 5,586,011 A | 12/1996 | Alexander | |
| 6,324,907 B1 | 12/2001 | Halteren et al. | |
| 7,154,047 B2* | 12/2006 | Howard | 174/260 |
| 7,209,368 B2* | 4/2007 | Lauffer et al. | 361/816 |
| 7,360,308 B2* | 4/2008 | Oggioni et al. | 29/852 |
| 7,394,458 B2 | 7/2008 | Lyon et al. | |
| 7,564,115 B2 | 7/2009 | Chen et al. | |
| 7,767,913 B2* | 8/2010 | Corisis et al. | 174/262 |
| 7,776,741 B2 | 8/2010 | Reid et al. | |
| 7,986,211 B2* | 7/2011 | Kim et al. | 336/200 |
| 2002/0164107 A1* | 11/2002 | Boudreau et al. | 385/14 |
| 2005/0152184 A1* | 7/2005 | Chiu | 365/185.02 |
| 2006/0151205 A1 | 7/2006 | Lim | |
| 2006/0229683 A1 | 10/2006 | Wang et al. | |
| 2009/0045904 A1* | 2/2009 | Chen et al. | 336/200 |
| 2009/0224376 A1* | 9/2009 | Choi et al. | 257/659 |
| 2009/0224405 A1 | 9/2009 | Chiou et al. | |
| 2010/0019859 A1* | 1/2010 | Lascari | 333/33 |

OTHER PUBLICATIONS

Pak et al. "3GHz Through-Hole Signal Via Model Considering PowedGround Plane Resonance Coupling and Via neck Effect" 2003 Electronic Components and Technology Conference, May 30, 2003, p. 1017-p. 1022.

Pak et al., "Coupling of Through-Hole Signal Via to Power/Ground Resonance and Excitation of Edge Radiation in Multi-Layer PCB", Electromagnetic Compatibility, 2003 IEEE International Symposium on, Aug. 18, 2003, vol. 1, p. 231-p. 235.

Choi et al., "Effects of parasitic resonance on a vertical transition in multilayer printed circuit boards", Microwave and Optical Technology Letters, vol. 52, No. 9, Sep. 2010, p. 2098-p. 2100.

* cited by examiner

US 8,853,848 B2

INTERCONNECTION STRUCTURE, APPARATUS THEREWITH, CIRCUIT STRUCTURE THEREWITH

CROSS-REFERENCE TO RELATED APPLICATION

This application claims the priority benefit of Taiwan application serial no. 100102523, filed Jan. 24, 2011. The entirety of the above-mentioned patent application is hereby incorporated by reference herein and made a part of this specification.

TECHNICAL FIELD

The disclosure generally relates to an interconnection structure, an apparatus with the interconnection structure, and a method to prevent an interconnection structure from electromagnetic interference (EMI).

BACKGROUND

Currently, a via on a substrate plays a role of providing a vertical path between interconnections. Under a low frequency operation, the paths formed by the vias are not very necessary to control the impedance thereof since the dimension of the via is really quite small (for example, <0.1λ) relatively to the wavelength (λ) of low operation frequency. At the time, the vias can be respectively treated as a simple electrical connection point, the length of the via can be neglected and it affects the circuit inconsiderably.

When the operation frequency is increased however, the physical dimension of a via is near to the wavelength of the operation frequency (for example, 1λ. At the time, the via should be treated as an additional component for a circuit. Hence, the additional via component in the circuit needs to be designed and under control so that the circuit can normally function.

A traditional via connects one terminal only, so that a return path must be designed to accomplish the signal transmission. As a result, during the traditional via is fulfilling a signal transmission, at least two vias are often needed, wherein one is signal via and another is ground via and/or power via. The second via is for providing a return path and solving the problem related to signal transmission integrity, as shown in FIGS. 1A and 1B.

In FIG. 1A, for example, a printed circuit board (PCB) with four layers includes two up and down signal layers 120 and 150 and a ground layer 130 and a power layer 140 both located between the two layers 120 and 150. A signal via 110 is disposed between the up signal layer 120 and the down signal layer 150. In FIG. 1A, a current path 102 from a source to a load and a current return path 104 are shown. In order to improve the signal transmission integrity, at least two vias are often designed as shown by FIG. 1B, in which one is signal via 110 and another is ground via and/or power via. In the example, the return path is implemented by a ground via 160. With the above-mentioned design, the length of the return path can be reduced and the signal integrity can be improved. In fact, the return path needs to be figured out with an effective design so as to achieve the design requirement of impedance match and reducing EMI.

SUMMARY

In an exemplary embodiment, an interconnection structure is introduced, which is disposed between a first conductive layer and a second conductive layer, in which the first conductive layer and the second conductive layer are substantially parallel to each other. The first conductive layer and the second conductive layer respectively include a first signal trace and a second signal trace. The interconnection structure includes a conductor pillar and a shielding wall pillar. The conductor pillar goes through between the first conductive layer and the second conductive layer and is electrically connected to the first signal trace and the second signal trace. The shielding wall pillar is disposed between the first conductive layer and the second conductive layer and electrically connected to a reference conductive wire, in which the shielding wall pillar is located at a portion of an external region surrounding the conductor pillar between the first conductive layer and the second conductive layer and electrically coupled to the conductor pillar.

In an exemplary embodiment, a circuit structure is introduced, which includes a first conductive layer, a second conductive layer, a reference conductive wire, a conductor pillar and a shielding wall pillar. The first conductive layer includes a first signal trace. The second conductive layer includes a second signal trace, in which the second conductive layer is substantially parallel to the first conductive layer. The reference conductive wire is located between the first conductive layer and the second conductive layer. The conductor pillar goes through between the first conductive layer and the second conductive layer and is connected to the first signal trace of the first conductive layer and the second signal trace, but electrically isolated from the reference conductive wire. The shielding wall pillar is disposed between the first conductive layer and the second conductive layer and electrically connected to the reference conductive wire, in which the shielding wall pillar is located at a portion of an external region surrounding the conductor pillar between the first conductive layer and the second conductive layer and electrically coupled to the conductor pillar.

Several exemplary embodiments accompanied with figures are described in detail below to further describe the disclosure in details.

BRIEF DESCRIPTION OF THE DRAWINGS

The accompanying drawings are included to provide a further understanding, and are incorporated in and constitute a part of this specification. The drawings illustrate exemplary embodiments and, together with the description, serve to explain the principles of the disclosure.

FIGS. 3A-3D are diagrams of an interconnection structure provided by the present disclosure and illustrating the signal integrity thereof, in which FIGS. 3B and 3C illustrate the distribution of electrical field strength.

DETAILED DESCRIPTION OF DISCLOSED EMBODIMENTS

Currently, the signal transmission on a substrate needs a corresponding return path. Hence, a signal via and a ground via and/or a power via are required during vertically transmitting a signal. Since a signal trace has a corresponding ground plane near to the trace and the distance between the ground plane and the signal trace is fixed, so that the required impedance control can be achieved.

When the signal has been transmitted to a signal via however, since no another corresponding vertical ground terminal or ground path to control the signal flowing through the signal via, so that the signal flowing the via has no nearby and directly available ground terminal or ground path, which makes impedance match failed. The problem would further cause various signal integrity troubles including reflection, EMI, discontinuity, crosstalk, etc. Even a ground via is located near by the signal via by design, there still is penetration of partial leakage field so as to cause the EMI problem, and the phenomena are specially serious when the substrate has a medium with low insulation property, for example, a silicon interposer substrate.

Figure 1A:
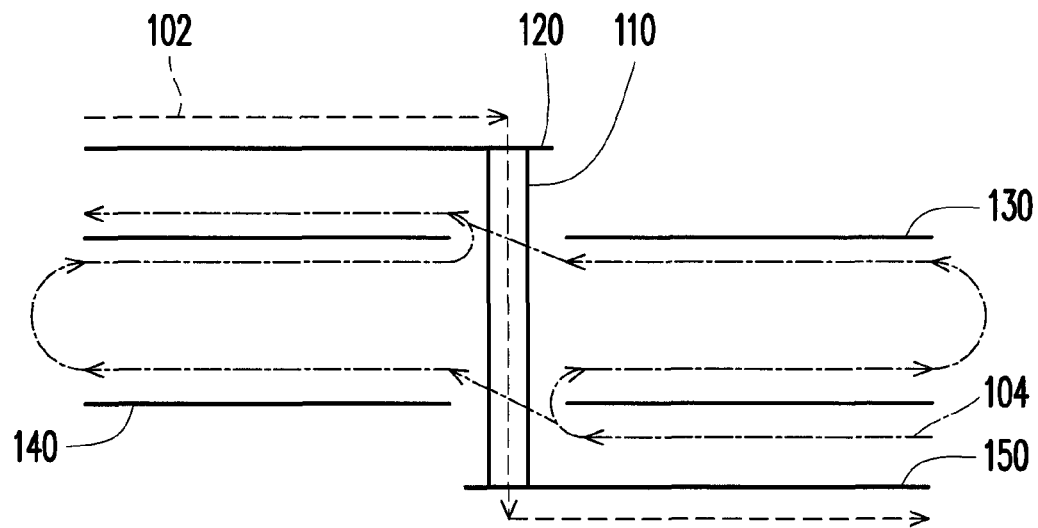
FIGS. 1A and 1B are two schematic diagrams respectively illustrating a traditional PCB structure with four layers and the current paths thereof.
Figure 1B:
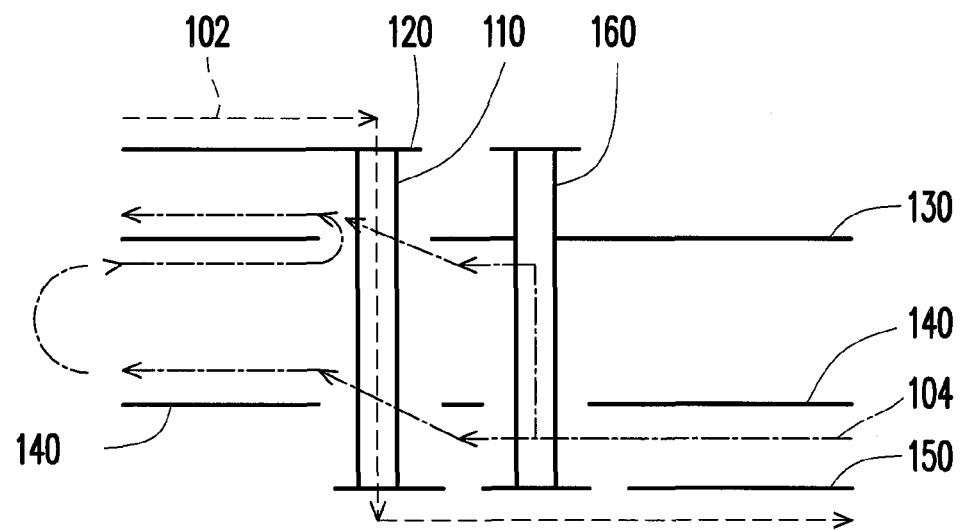
Figure 2A:
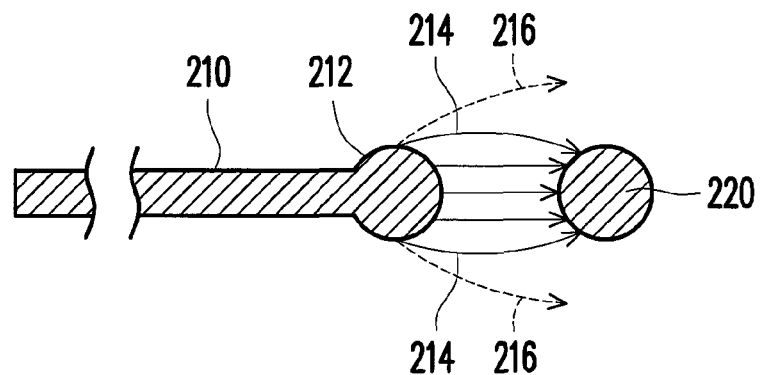
FIGS. 2A-2C are diagrams illustrating a via structure and the signal integrity thereof.
Figure 2B:
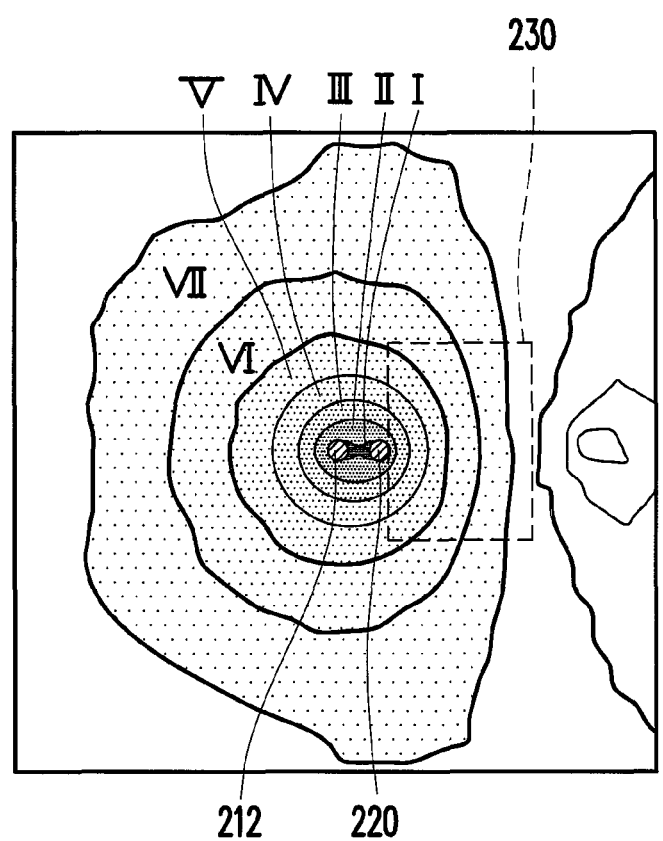
Figure 2C:
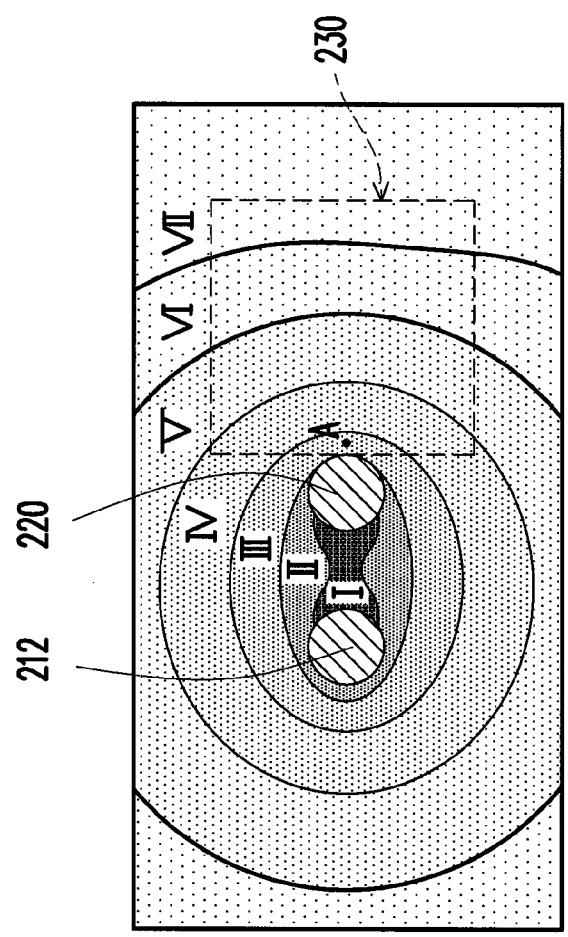

Referring to FIGS. 2A-2C, the diagrams illustrate a via structure and the signal integrity thereof. A signal trace 210 is connected to a signal via 212 and there is, for example, a ground via 220 at a side of the signal via 212. According to a common design, the ground via has a fixed diameter or dimension to achieve the goal of reducing the current return path. However, in the prior art, the cross-sectional shapes of a signal via, a power via and a ground via are all circle shapes, so that it is unable to avoid random flux or dispersion of electrical field, and the phenomenon is one of disaster sources triggering the EMI effect. As shown by FIG. 2A, in addition to coupled electrical field lines 214 (for example, marked with solid lines), there are also other penetrating or scramble electrical field lines 216 (for example, marked with dotted lines) between the signal via 212 and the ground via 220, which causes the dispersion of electrical field. The penetrating of the partial leakage field causes the EMI problem, which further leads to a noticeable distributed electrical field at a region 230 at the right side of the ground via 220, as shown by FIG. 2B. FIG. 2C further illustrates the distribution of the electrical field strength represented by gradient. For explanation convenience, the distribution of the electrical field is divided into several different regions according to the strength thereof, for example, the electrical field produced by the signal via 212 and the ground via 220 is divided into seven strength distribution regions I, II-VII. The electrical field strength of the region I is, for example, between 1.7098e+004 V/m and 3.5440e+004 V/m, i.e., 17098–35440 V/m. The electrical field strength of the region II is, for example, between 8.2485e+004 V/m and 1.7098e+004 V/m, i.e., 8248.5–17098 V/m. The distributed electrical field at the region 230 at the right side of the ground via 220 includes, for example, the region III, the region IV, the region V and the region VII respectively with a strength distribution from large one to small one, i.e. they are descended in stepped way respectively with 3.9794e+003–8.2485e+003V/m, 1.9198e+003–3.9794e+003 V/m, 9.2617e+002–1.9198e+003 V/m, 4.4682e002–9.2617e+002 V/m and 2.1556e+002–4.4682e002 V/m.

The position A in FIG. 2C is located at the region III with a strength distribution roughly between 3.9794e+003 V/m and 8.2485e+003 V/m, in which the mid value thereof is roughly 6.1140e+003 V/m.

The disclosure provides an interconnection structure design. In an exemplary embodiment, the disclosure provides an interconnection structure disposed between a first conductive layer and a second conductive layer, where the first conductive layer and the second conductive layer are substantially parallel to each other. The first conductive layer and the second conductive layer respectively include a first signal trace and a second signal trace. The interconnection structure includes a conductor pillar and a shielding wall pillar. The conductor pillar goes through between the first conductive layer and the second conductive layer and is electrically connected to the first signal trace and the second signal trace. The shielding wall pillar is disposed between the first conductive layer and the second conductive layer and electrically connected to a reference conductive wire, in which the shielding wall pillar is disposed at a portion of an external region surrounding the conductor pillar between the first conductive layer and the second conductive layer and electrically coupled to the conductor pillar.

The disclosure provides an interconnection structure design, which includes a conductor pillar and a shielding wall pillar with an in pair or in group architecture, in which in addition to the conductor pillar serves as a signal via, the architecture further includes a shielding wall pillar with a cross-sectional shape different from that of the conductor pillar, and the shielding wall pillar is connected to, for example, a ground layer or a power layer. The ground or power shielding wall pillar with a cross-sectional shape different from that of the conductor pillar would make the conductor pillar serve as a connection with a designed impedance and the capability of controlling impedance based on the specific or particular shape design of the shielding wall pillar, and would moreover solve, for example, the problem related to the signal integrity for the signal transmitted on the vertical via.

In one of some embodiments, the interconnection structure provided by the disclosure is located between a first conductive layer and a second conductive layer. The first conductive layer and the second conductive layer are substantially parallel to each other and respectively include a first signal trace and a second signal trace. The interconnection structure includes a conductor pillar and a shielding wall pillar. The conductor pillar goes through between the first conductive layer and the second conductive layer and is electrically connected to the first signal trace and the second signal trace. The shielding wall pillar is disposed between the first conductive layer and the second conductive layer and electrically connected to a reference conductive wire. The shielding wall pillar is further disposed at a portion of an external region surrounding the conductor pillar between the first conductive layer and the second conductive layer, and electrically coupled to the conductor pillar.

In at least one of some embodiments, the reference conductive wire is electrically connected to one of the ground layer and the power layer. In the embodiments, the ground layer or the power layer is located at one of the first conductive layer and the second conductive layer. When the first conductive layer and the second conductive layer are substantially parallel to each other, the ground layer or the power layer may be located between the first conductive layer and the second conductive layer, or may be located at any position substantially parallel to the first conductive layer and the second conductive layer. In one of the embodiments, the reference conductive wire may be located on a plane same as the first conductive layer and/or the second conductive layer and electrically isolated from the second signal trace but electrically connected to one of the ground level or the power level.

The above-mentioned interconnection structure design can change the cross-sectional shapes of the conductor pillar and the shielding wall pillar according to the desire requirement so as to enhance the electromagnetic shielding effect and achieve the effect of the impedance control and design.

Figures 3A, 3B:
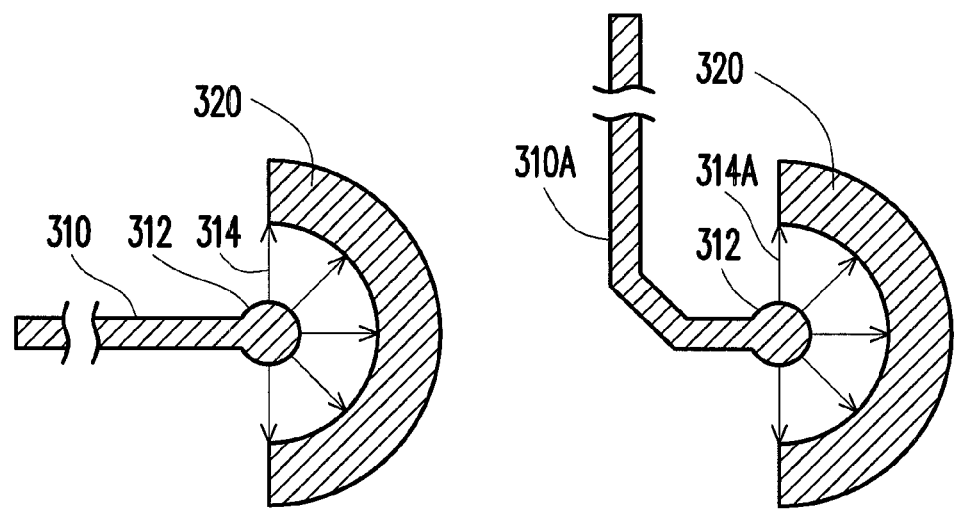

Referring to FIG. 3A, it is a diagram showing one of the plural embodiments. A signal trace 310 herein is connected to a conductor pillar 312, and there is a shielding wall pillar 320 with, for example, semi-circle shape in cross-sectional view at a side of the conductor pillar 312. A different signal trace 310 is connected to the conductor pillar 312 and there is a shielding wall pillar 320 with, for example, semi-circle shape at a side of the conductor pillar 312, referring to FIG. 3B.

A conventional ground via with circle shape is unable to effectively block electrical field. As a result, abundant electrical field still exists at the right side of the shielding wall pillar. According to the interconnection structure design provided by the disclosure, however, the shielding wall pillar 320 is electrically coupled to the conductor pillar 312 as shown in FIG. 3A, and the shielding wall pillar 320 may be a structure of shielding wall pillar for shielding off the electric field lines 314 from the conductor pillar 312 to the shielding wall pillar 320, and the shielding wall pillar 320 of FIG. 3A has the same structure.

Figure 3C:
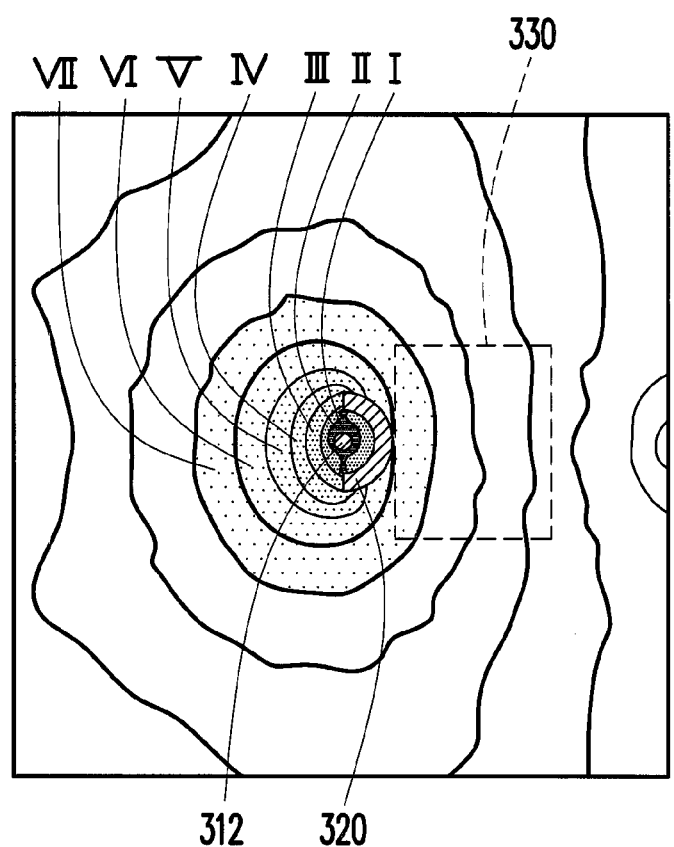
Figure 3D:
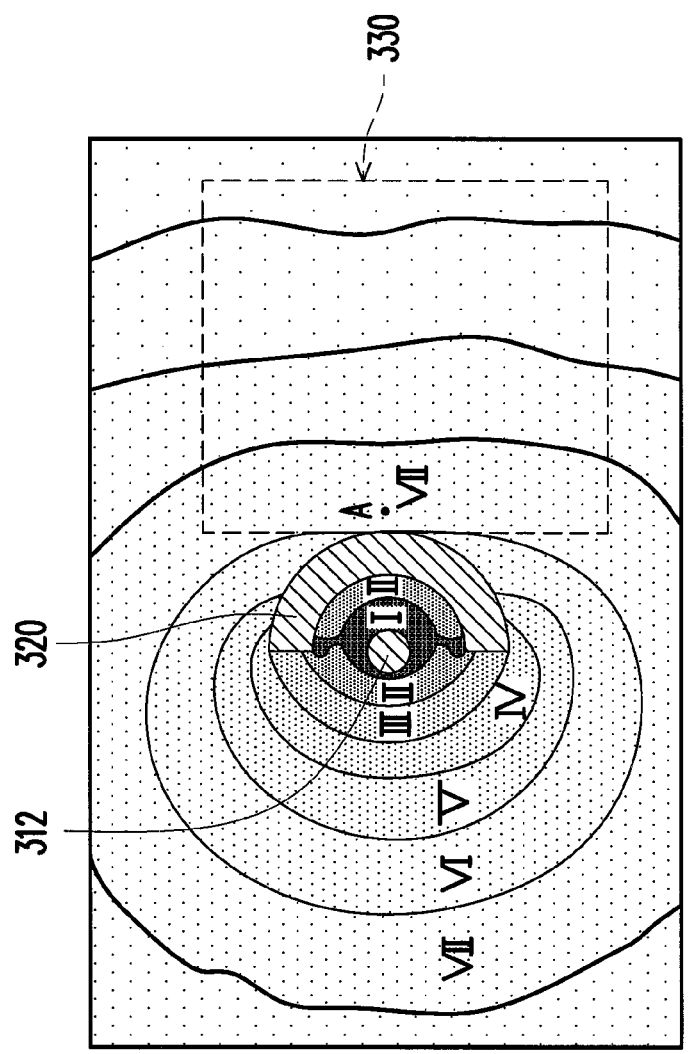

The above-mentioned disposition between the conductor pillar 312 and the shielding wall pillar 320 may have the effect of shielding off electrical field so as to control the dispersive electrical field and largely reduce the leakage field. As shown by FIGS. 3C and 3D, the electrical field strength at the right-side region 330 of the shielding wall pillar 320 is largely reduced.

In one of some embodiments, a provided interconnection structure design adopts semi-moon shape of shielding wall pillar, which encloses the whole conductor pillar to almost a half extent so as to control the electrical field direction and the strength thereof during a signal is flowing the conductor pillar, reduce the electrical field energy diffusing to the right side of the shielding wall pillar and achieve the ground shielding effect, as shown by FIG. 3C and an enlarged diagram FIG. 3D.

Referring to FIG. 3D, the distribution of the electrical field herein is divided into different regions according to the strength thereof. Accordingly, the electrical field produced by the conductor pillar 312 and the shielding wall pillar 320 is divided into, for example, seven strength distribution regions I-VII. The region VII at the right-side region 330 of the shielding wall pillar 320 has the most strong distribution of the electrical field, where the electrical field strength is between 2.1556e+002 V/m and 4.4682e+002 V/m, i.e., 215.56–446.82 V/m.

Taking the position A in FIG. 2C as an example, since the position A in FIG. 2C has a strength distribution of the region III, the mid value thereof should be 6.1140e+003 V/m. However, the same position A in FIG. 3D, since it is located at the region VII, has a strength between 2.1556e+002 V/m and 4.4682e+002 V/m, i.e., 215.56–446.82 V/m with a mid value of 3.3119e+002 V/m. It can be seen from the above-mentioned comparison under the shielding field of the shielding wall pillar 320, the electrical field strength for a same position drops from 6.1140e+003 V/m to 3.3119e+002 V/m.

In the interconnection structure provided by the disclosure, the conductor pillar and the shielding wall pillar may be disposed in pair or in group, which has, in addition to the conductor pillar, the shielding wall pillar with geometric shape in cross-sectional view different from that of the corresponding conductor pillar, and the shielding wall pillar is electrically connected to a ground layer or a power layer and serves as, for example, a ground via or a power via.

The shielding wall pillar with a geometric shape different from the geometric shape of the conductor pillar (usually, circle shape) makes the conductor pillar function as a vertical connection with a designed impedance and the capability of controlling impedance. For example, the conductor pillar serves as a signal via, the above-mentioned disposition may solve, for example, the problem related to the signal integrity on the vertical via. The shielding wall pillar is disposed surrounding the side wall of the above-mentioned conductor pillar and electrically coupled to at least a surrounding area of the side wall surface of the above-mentioned conductor, in which the value of the surrounding area is determined by the distribution of the electrical field produced by the conductor pillar during a current is flowing. The value of the surrounding area on the side wall surface of the conductor pillar where the shielding wall pillar is electrically coupled to is just the value of the coupling area, and the coupling area may be sufficiently large to shield off or isolate the electrical field strength located on another side surface of the shielding wall pillar facing the conductor pillar.

Figure 3E:
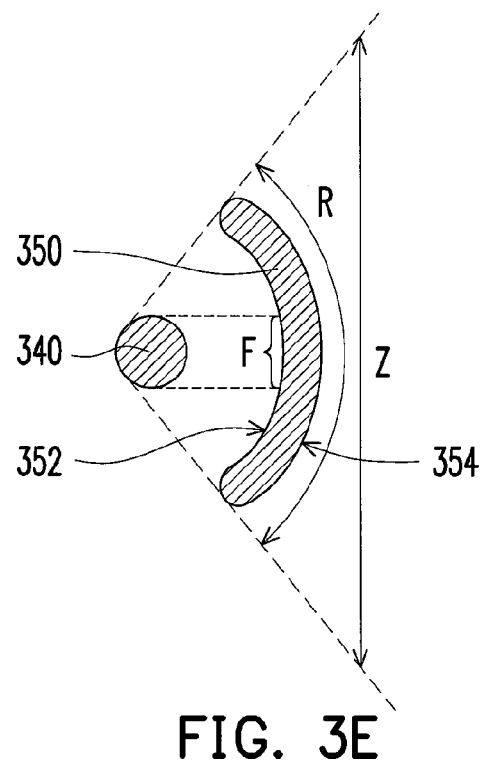
FIGS. 3E and 3F are respectively a cross-sectional diagram and a three-dimensional side view diagram of a pair of disposed conductor pillar and shielding wall pillar in an interconnection structure provided by the disclosure according to an embodiment.
Figure 3F:
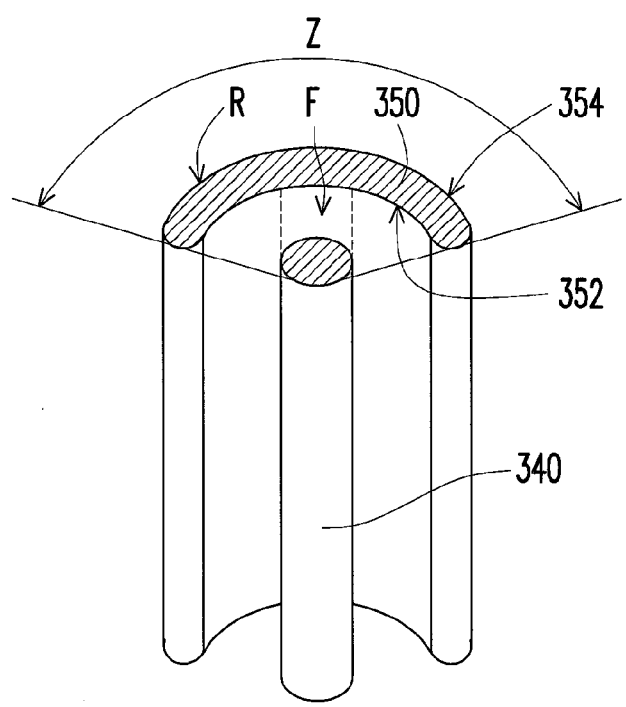

FIGS. 3E and 3F are respectively a cross-sectional diagram and a three-dimensional side view diagram of a pair of disposed conductor pillar and shielding wall pillar in an interconnection structure provided by the disclosure according to an embodiment. Referring to FIGS. 3E and 3F, a shielding wall pillar 350 is disposed surrounding the side wall of the conductor pillar 340. The projection area of the conductor pillar 340 facing the shielding wall pillar 350 is F and the area of the shielding wall pillar 350 facing the side wall 352 of the conductor pillar 340 is R, in which R is greater than F to a certain extent that the coupling area between the conductor pillar 340 and the shielding wall pillar 350 is greater than F. At the time, as shown by FIGS. 3E and 3F, any position point on the other direction region opposite to the region where the shielding wall pillar 350 faces the conductor pillar 340, i.e., any position point on the region Z where the other side wall 354 of the shielding wall pillar 350 faces has the effect of reduced electrical field strength. Consequently, the disposition between the conductor pillar 340 and the shielding wall pillar 350 can serve as a connection with a designed impedance and the capability of controlling impedance and can solve, for example, the problem related to the signal integrity on the vertical via.

In following, a part of the plural exemplary embodiments in the disclosure accompanied with figures is described, which the disclosure is not limited to.

Figure 4A:
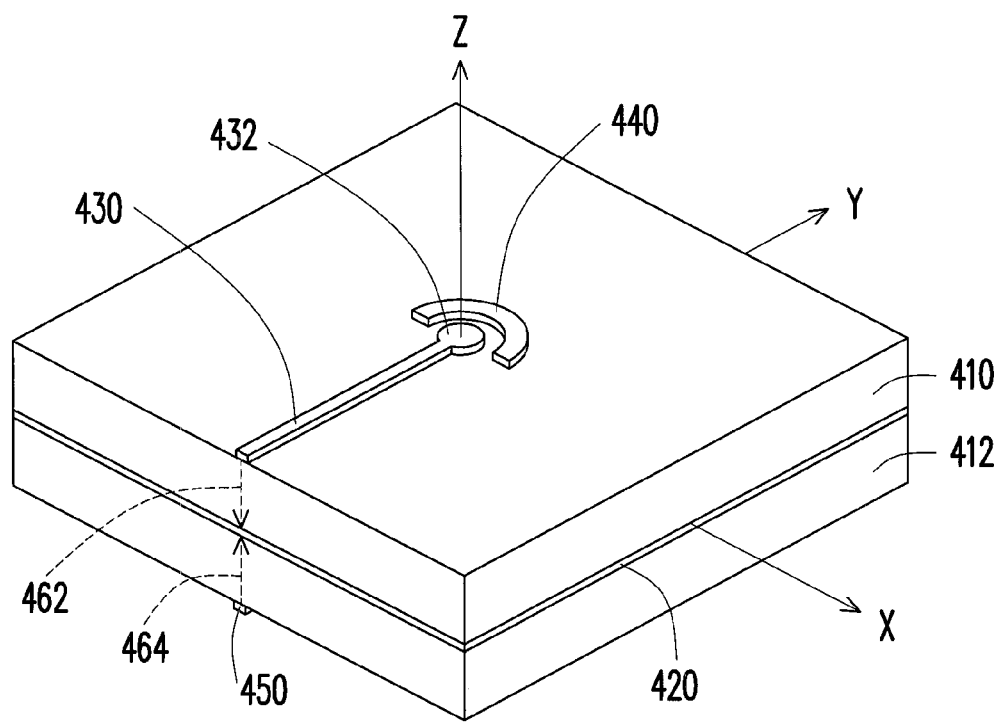
FIGS. 4A and 4B are diagrams of an interconnection structure provided by the disclosure used in a combination with three conductive layers according to an embodiment.
Figure 4B:
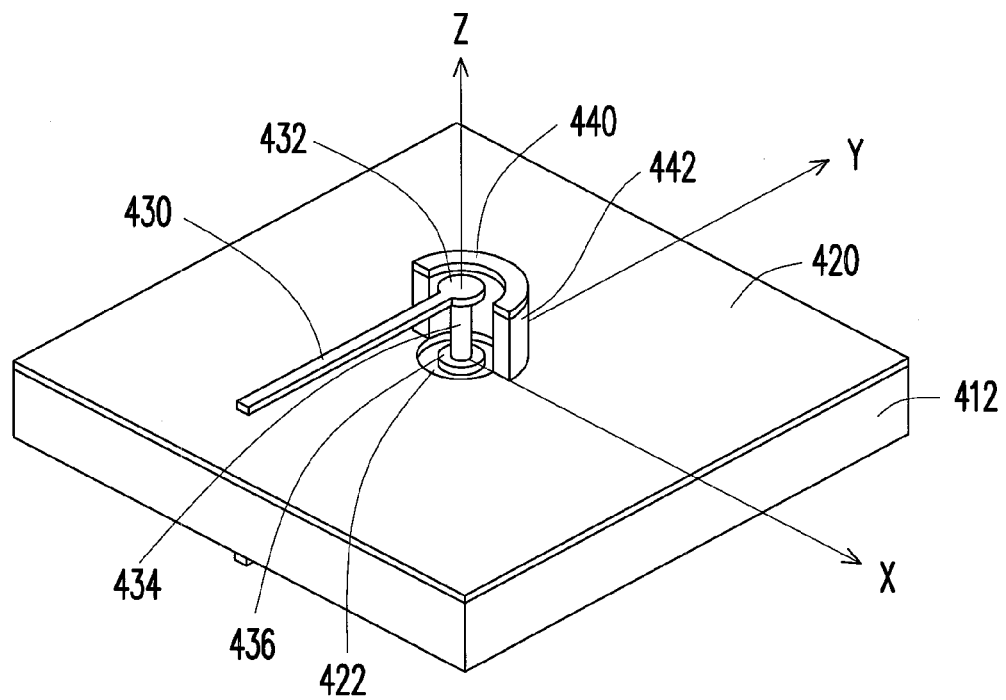

The Embodiment of FIGS. 4A and 4B

FIGS. 4A and 4B are diagrams of an interconnection structure provided by the disclosure used in a combination with three conductive layers according to one of some embodiments. A combination with three conductive layers is built in an insulation plate, and the combination with three conductive layers from top to down is divided into a first conductive layer, a second conductive layer and a third conductive layer. The middle second conductive layer can be one of power layer and ground layer. The first conductive layer and the third conductive layer are substantially parallel to each other and respectively include a microstrip line type transmission line. Referring to FIGS. 4A and 4B, for example, the first conductive layer includes a signal trace 430 and the third conductive layer includes a signal trace 450. The second conductive layer is, for example, a ground layer 420. The ground layer 420 in the embodiment is located between the first conductive layer and the third conductive layer, but in other optional embodiments, the ground layer 420 may be located at any parallel position between or outside the first conductive layer and the third conductive layer. A non-conductor material layer 410 is between the signal trace 430 and the ground layer 420 and another non-conductor material layer 412 is between the ground layer 420 and the signal trace 450. The insulation plate can include one of silicon, glass, PCB and ceramic substrates. In another embodiment, the insulation plate can also include organic substrate or flexible substrates.

The end of the signal trace 430 includes a conductor pillar structure. An end of the conductor pillar structure is a conductor pillar land 432 and a conductor pillar 434 going through the insulation layer 410 in the middle of the conductor pillar land 432, and another end of the structure is another conductor pillar land 436. The conductor pillar land 436 is located at the same height position as the ground layer 420 and includes a ground anti-ring 422 for electrically isolating from the ground layer 420. Since the transmission line structure is a microstrip-line-type transmission line, so that the signal is transmitted from the signal trace 430 of the third conductive layer, via the conductor pillar 434, then directly going through the insulation plate (including the non-conductor material layers 410 and 412), to the signal trace 450 of the third conductive layer.

In the interconnection structure provided by the disclosure, the conductor pillar and the shielding wall pillar may be disposed in pair or in group, which has, in addition to the conductor pillar structure, the shielding wall pillar structure with a geometric shape different from that of the corresponding conductor pillar. The shielding wall pillar structure includes a shielding wall pillar land 440, a shielding wall pillar 442 and another shielding wall pillar land located at the third conductive layer (not shown).

In practical applications, the dimensions of the above-mentioned shielding wall pillar land and shielding wall pillar are different from each other, and usually the dimension of the shielding wall pillar land is greater than the dimension of the shielding wall pillar. In the same way, the dimensions of the above-mentioned conductor pillar land and conductor pillar are different from each other in real applications. The conductor pillar and the shielding wall pillar may be hollow type, filling up type or that of adding a conductive filling of different materials. All the types belong to one of the scopes covered by the disclosure, which the disclosure is not limited to.

The electrical coupling between the first conductive layer, the third conductive layer and the middle ground layer is shown by FIG. 4A. The electrical field direction from the signal trace 430 to the ground layer 420 is marked by arrow 462, while the electrical field direction from the signal trace 450 to the ground layer 420 is marked by arrow 464.

When the conductor pillar and shielding wall pillar structure is respectively used in a signal via and a ground via, as the depiction above, when the operation frequency is increased however, the physical dimension of a via is near to the wavelength of the operation frequency, for example, $1\lambda$ ($\lambda$ is the wavelength of the operation frequency). At the time, the via should be treated as an additional component for a circuit. Hence, the additional via component in the circuit needs to be designed and under control so that the circuit can normally function, and the conductor pillar 434 and the shielding wall pillar 442 are disposed in group along the vertical direction between the first conductive layer, the third conductive layer and the middle ground layer. In the embodiment, the geometric shape of the section of the shielding wall pillar 442 is semi-moon shape. The concave edge of the semi-moon shape faces or backs to the conductor pillar 434 so that the conductor pillar 434 is electrically coupled to the shielding wall pillar 442 and the coupling is able to shield off a part of the electrical field of the conductor pillar 434 distributed in the vertical direction.

Figure 5A:
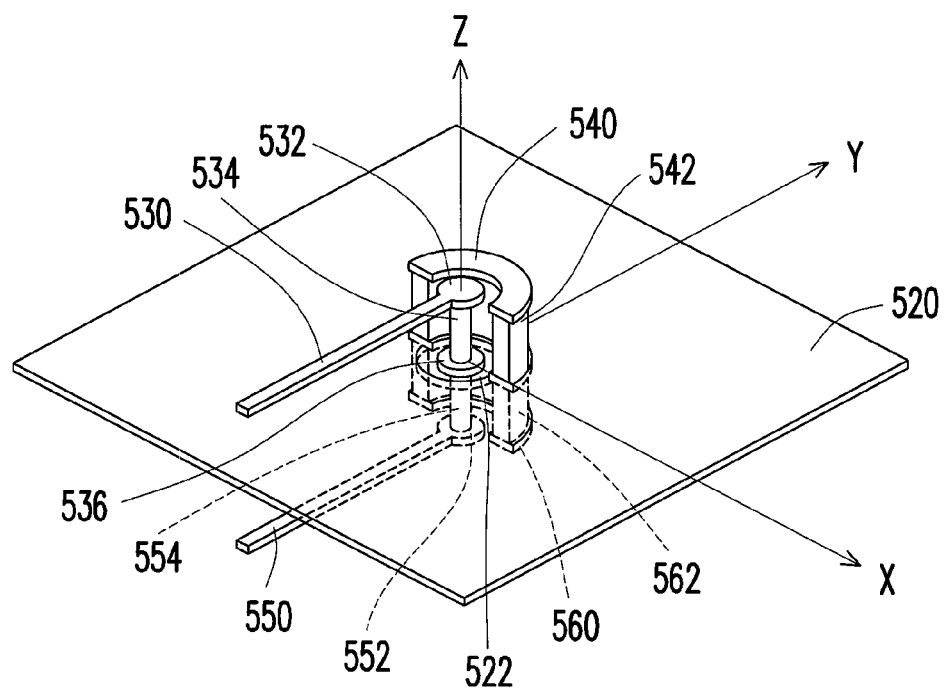
FIGS. 5A and 5B are diagrams of an interconnection structure provided by the disclosure used in a combination with three conductive layers according to an embodiment.
Figure 5B:
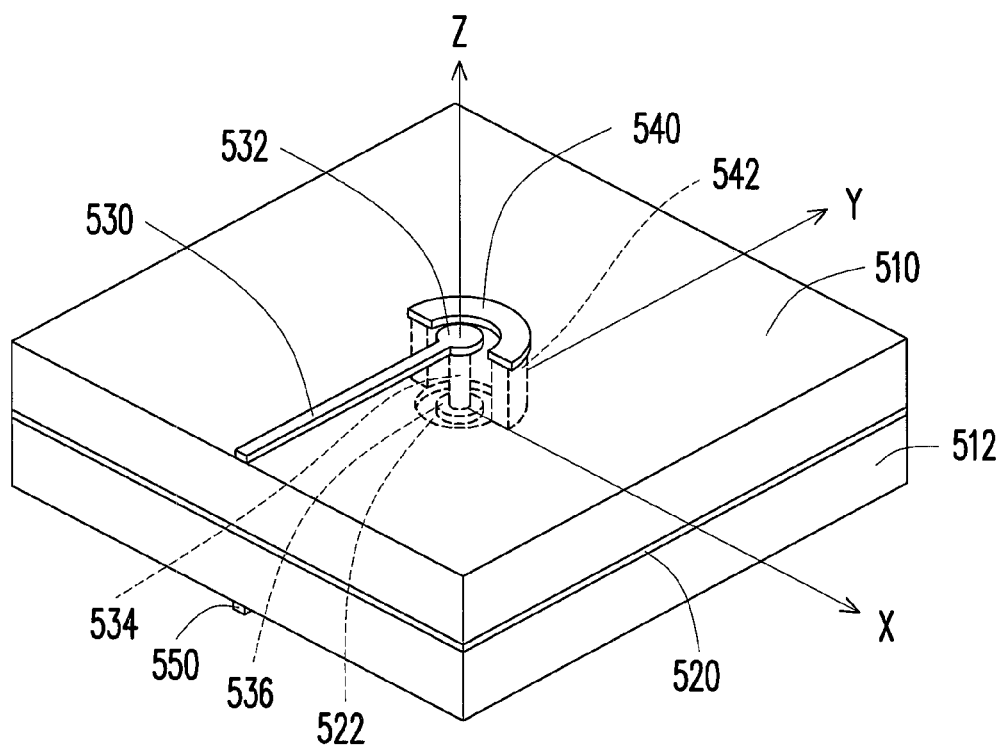

The Embodiment of FIGS. 5A and 5B

FIGS. 5A and 5B are diagrams of an interconnection structure provided by the disclosure used in a combination with three conductive layers according to an embodiment. A combination with three conductive layers is built in an insulation plate, and the combination with three conductive layers from top to down includes a first conductive layer, a second conductive layer and a third conductive layer. The first conductive layer and the third conductive layer are substantially parallel to each other and respectively include a symmetrical up-and-down microstrip line architecture. The second conductive layer can be one of power layer and ground layer and is in following, for example but not limited to, a ground layer. Referring to FIGS. 5A and 5B, the first conductive layer includes a signal trace 530, the third conductive layer includes a signal trace 550 and the ground layer 520 is located between the first conductive layer and the third conductive layer. A non-conductor material layer 510 is between the signal trace 530 and the ground layer 520 and another non-conductor material layer 512 is between the ground layer 520 and the signal trace 550. The insulation plate can include one of silicon, glass, PCB and ceramic substrate. In another embodiment, the insulation plate can also include organic substrate or flexible substrate.

The end of the signal trace 530 includes a conductor pillar structure. An end of the conductor pillar structure is a conductor pillar land 532 and a conductor pillar 534 going through the insulation layer 510, and another end of the structure is another conductor pillar land 536. The conductor pillar land 536 is located at the same position as the ground layer 520 and includes a ground anti-ring 522 for electrically isolating from the ground layer 520. An end of the signal trace 550 also includes a conductor pillar structure, which includes a conductor pillar land 552 and a conductor pillar 554 going through the non-conductor material layer 512 in the middle of the conductor pillar land 552, while another end is connected to the conductor pillar land 536.

The above-mentioned conductor pillars 534 and 554 cab be a same conductor pillar directly going through the non-conductor material layers 510 and 512 and electrically connected to the signal trace 530 of the first conductive layer and the signal trace 550 of the third conductive layer.

Since the transmission line structure is a symmetrical up-and-down microstrip line architecture, so that during the signal is transmitting on an X-Y plane, the signal transmitting is performed through a current return path formed by the signal trace 530 plus the middle ground layer 520.

In the embodiment of an interconnection structure provided by the disclosure, the conductor pillar and the shielding wall pillar may be disposed in pair or in group. As a result, as shown by FIGS. 5A and 5B, the first shielding wall pillar structure is disposed correspondingly to the conductor pillar 534 and the second shielding wall pillar structure is disposed correspondingly to the conductor pillar 554, in which the first shielding wall pillar structure includes the shielding wall pillar land 540 and the shielding wall pillar 542, and the second shielding wall pillar structure includes the shielding wall pillar land 560 and the shielding wall pillar 562.

The geometric shapes of the sections of the shielding wall pillars 542 and 562 may be various different geometric shapes in a cross-sectional view. In the embodiment, the shapes are semi-moon shape. The concave edges of the semi-moon shapes respectively face or back to the conductor pillars 534 and 554. The electrical coupling between the conductor pillars and the shielding wall pillars can shield the electrical fields of the conductor pillars distributed in the vertical direction.

Figure 6A:
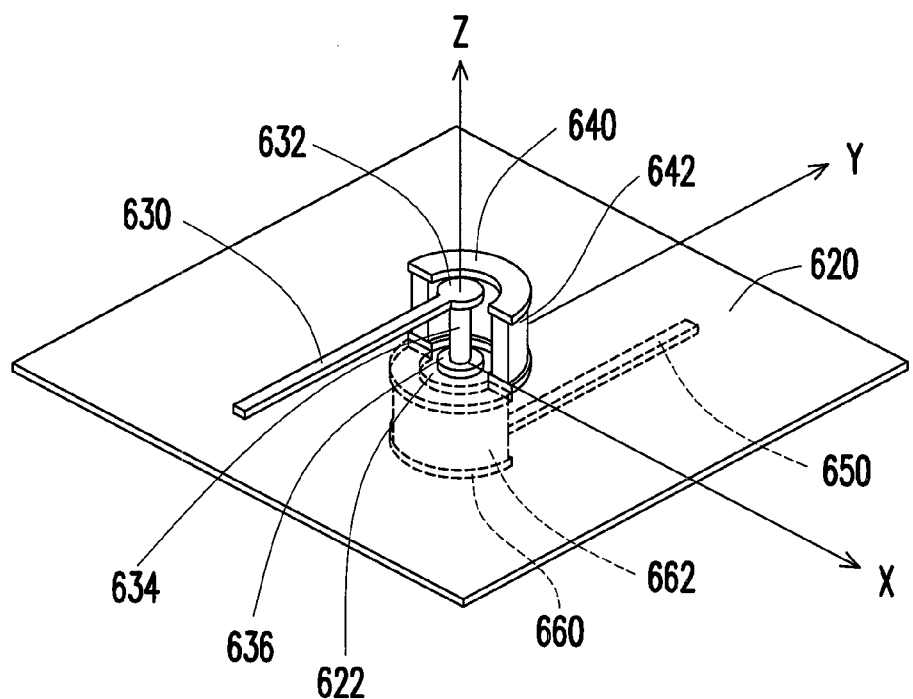
FIGS. 6A and 6B are diagrams of an interconnection structure provided by the disclosure used in a combination with three conductive layers according to an embodiment.
Figure 6B:
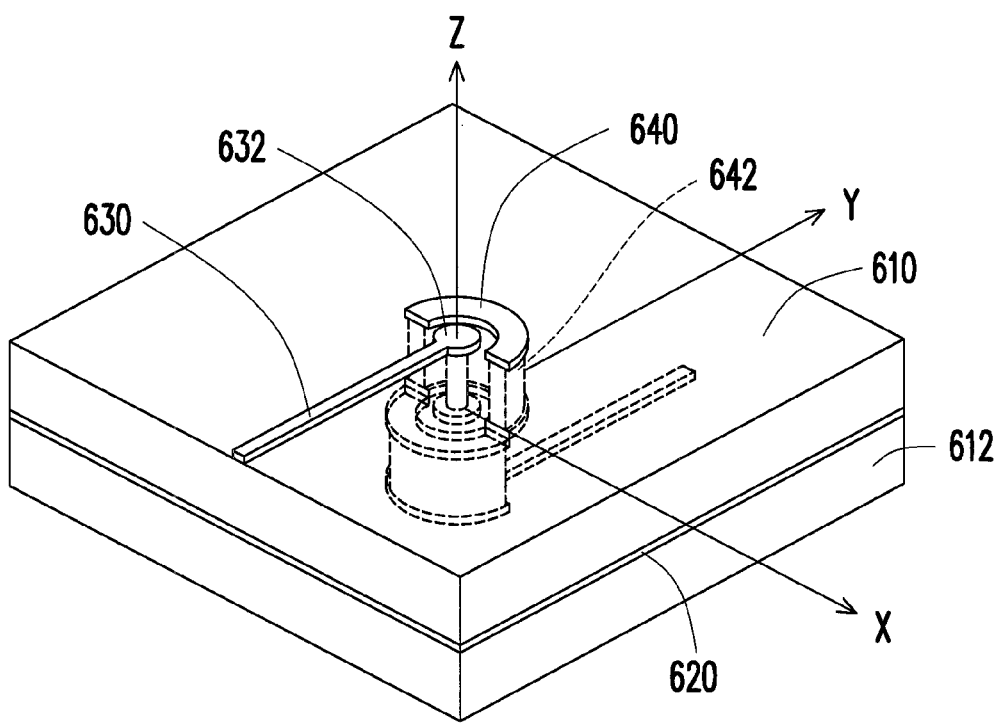

The Embodiment of FIGS. 6A and 6B

FIGS. 6A and 6B are diagrams of an interconnection structure provided by the disclosure used in a combination with three conductive layers according to an embodiment. A combination with three conductive layers is built in an insulation plate, and the combination with three conductive layers from top to down includes a first conductive layer, a second conductive layer and a third conductive layer. The first conductive layer and the third conductive layer are substantially parallel to each other and respectively include a symmetrical up-and-down microstrip line architecture. The second conductive layer can be one of power layer and ground layer and is, for example in following but not limited to, a ground layer.

Referring to FIGS. 6A and 6B, the first conductive layer includes a signal trace 630, the third conductive layer includes a signal trace 650. The ground layer 620 is located between the first conductive layer and the third conductive layer. A non-conductor material layer 610 is disposed between the signal trace 630 and the ground layer 620 and another non-conductor material layer 612 is disposed between the ground layer 620 and the signal trace 650. The insulation plate may include one of silicon, glass, PCB and ceramic substrate. In another embodiment, the insulation plate may also include organic substrate or flexible substrate.

The end of the signal trace 630 includes a first conductor pillar structure. An end of the first conductor pillar structure is a conductor pillar land 632 and a conductor pillar 634 going through the insulation layer 610, and another end of the structure is another conductor pillar land 636. The conductor pillar land 636 is located at the same position as the ground layer 620 and includes a ground anti-ring 622 for electrically isolating from the ground layer 620. An end of the signal trace 650 also includes a second conductor pillar structure, which includes a conductor pillar land (not shown) and a conductor pillar (not shown) going through the non-conductor material layer 612 in the middle of the conductor pillar land, while another end is connected to the conductor pillar land 636 shared by the first conductor pillar structure.

The above-mentioned conductor pillars 634 and 654 can be a same conductor pillar directly going through the non-conductor material layers 610 and 612 and respectively electrically connected to the signal trace 630 of the first conductive layer and the signal trace 650 of the third conductive layer.

Since the transmission line structure herein is a microstrip line architecture, so that the signal is transmitted from the signal trace 630 of the first conductive layer and the negative direction in the XYZ coordinates shown by FIGS. 6A and 6B, directly going through the substrate (including the non-conductor material layers 610 and 612) through the conductor pillar 634 and then to the signal trace 650 of the third conductive layer and finally towards the positive Y direction.

In the embodiment of an interconnection structure provided by the disclosure, the conductor pillar and the shielding wall pillar are disposed in pair or in group. As a result, as shown by FIGS. 6A and 6B, the first shielding wall pillar structure is disposed correspondingly to the conductor pillar 634 and the second shielding wall pillar structure is disposed correspondingly to the conductor pillar 654, in which the first shielding wall pillar structure includes the shielding wall pillar land 640 and the shielding wall pillar 642, and the second shielding wall pillar structure includes the shielding wall pillar land 660 and the shielding wall pillar 662.

The geometric shapes of the sections of the shielding wall pillars 642 and 662 can be various different shapes. In the embodiment, the shapes are semi-moon shape. The concave edges of the semi-moon shapes respectively face frontward or backward to the conductor pillars 634 and 654. The electrical coupling between the conductor pillars and the shielding wall pillars may shield the electrical fields of the conductor pillars distributed in the vertical direction.

Many fabrication methods may be used to build the interconnection structure with three conductive layers as shown in FIGS. 6A and 6B. One of the methods is to use a bi-surfaces substrate serving as a core plate, in which the core plate includes two up/down whole metallic layers and an insulation medium between the two metallic layers. A plurality of holes are formed on the bi-surfaces substrate with a via drilling procedure or an etching procedure, followed by performing hole wall processing, for example, a desmearing and a flatness processing. Then, a metal implantation process, by using, for example, a sputtering process, is performed on the wall of the through hole, followed by performing plating on the conductor pillar. After that, a pattern defining process and a patterned etching are performed so as to complete the fabrications of the ground layer (the middle layer), the signal trace of the third conductive layer and the conductor pillar and shielding wall pillar both going through the core plate. Finally, the signal trace of the first conductive layer, the conductor pillar and the shielding wall pillar are completed by an adding layers process or a lamination process.

Figure 7A:
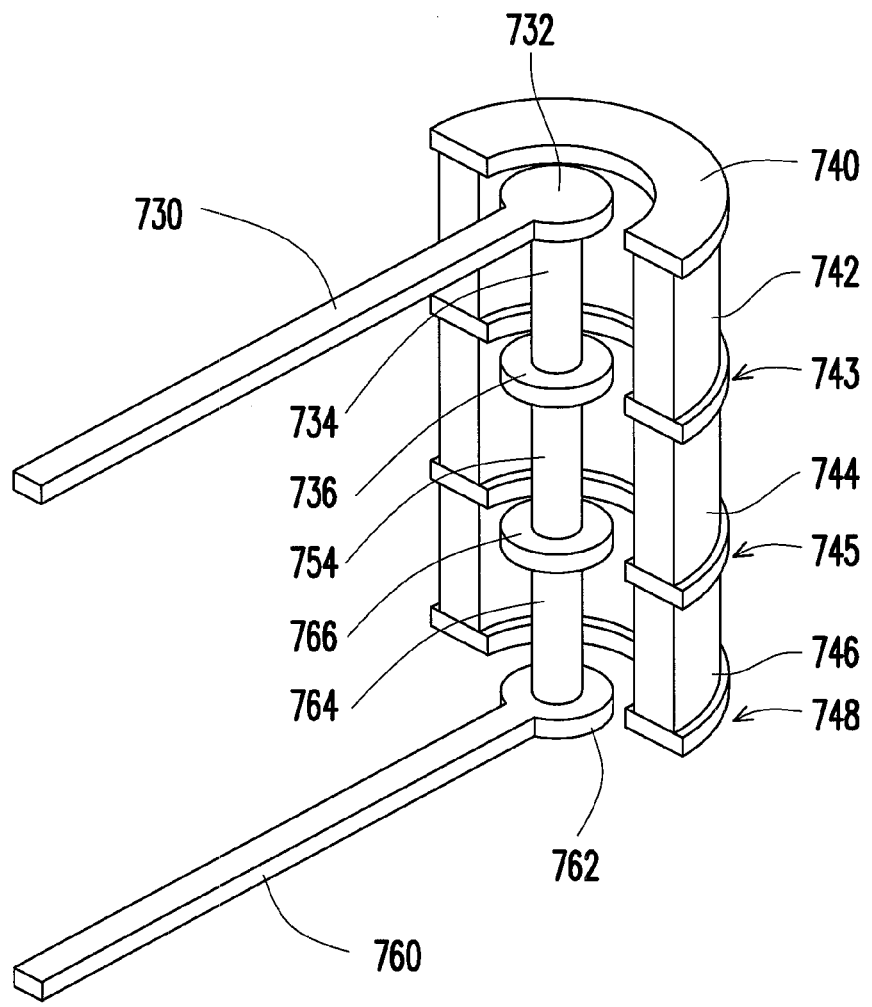
FIGS. 7A and 7B are diagrams of an interconnection structure provided by the disclosure used in a combination with four conductive layers according to an embodiment.
Figure 7B:
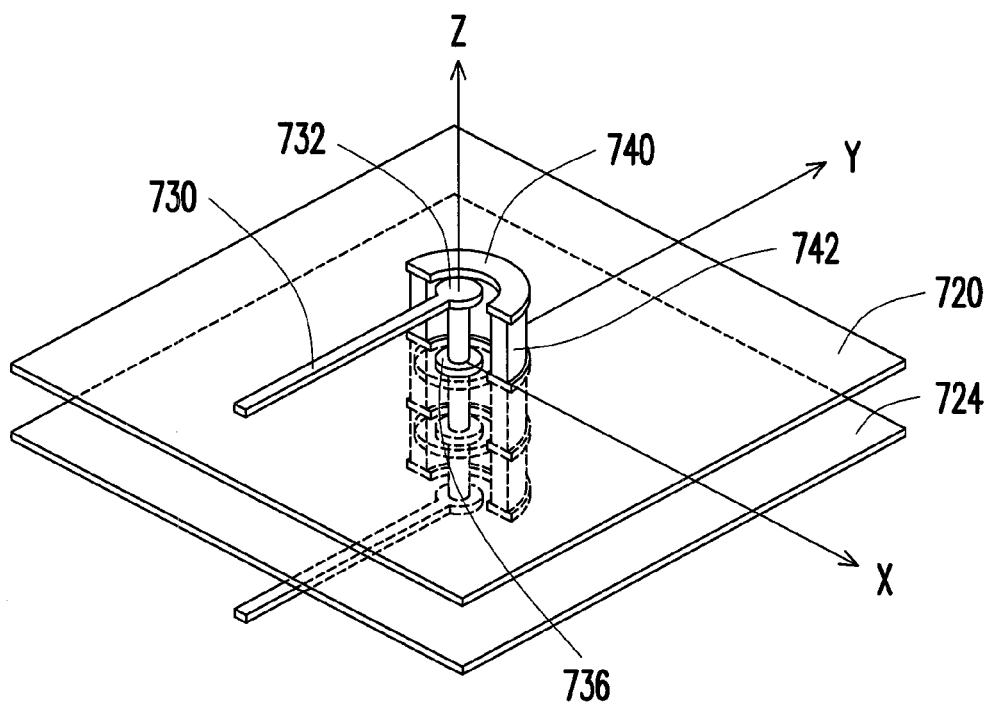

The Embodiment of FIGS. 7A and 7B

FIGS. 7A and 7B are diagrams of an interconnection structure provided by the disclosure used in a combination with four conductive layers according to one of embodiments. Referring to FIGS. 7A and 7B, a combination with four conductive layers is built in an insulation plate, and the combination with four conductive layers from top to down includes a first conductive layer, a second conductive layer, a third conductive layer and a fourth conductive layer. The second and third conductive layers in between can respectively be one of power layer and ground layer or a combination thereof. The first and fourth conductive layers are arranged by a symmetrical up-and-down microstrip-line architecture. Referring to FIGS. 7A and 7B, the first conductive layer includes a signal trace 730, the fourth conductive layer includes a signal trace 760 and the middle second and third conductive layers in the embodiment are, for example but not limited to, two ground layers 720 and 724. The insulation plate can include one of silicon, glass, PCB and ceramic substrate. In another embodiment, the insulation plate can also include organic substrate or flexible substrate.

An end of the signal trace 730 includes a conductor pillar structure. The conductor pillar structure includes a conductor pillar land 732, a conductor pillar 734, a conductor pillar land 736, a conductor pillar 754, a conductor pillar land 766, a conductor pillar 764 and a conductor pillar land 762.

The above-mentioned conductor pillars 734, 754 and 764 can be a same conductor pillar directly going through the insulation plate and respectively electrically connected to the signal trace 730 of the first conductive layer and the signal trace 760 of the fourth conductive layer.

Since the transmission line structure herein is a microstripline architecture, so that the signal is transmitted from the signal trace 730 of the first conductive layer, through the conductor pillar land 732, the conductor pillar 734, the conductor pillar land 736, the conductor pillar 754, the conductor pillar land 766, the conductor pillar 764 and the conductor pillar land 762, directly going through the insulation plate and then to the signal trace 760 of the fourth conductive layer.

In the embodiment of an interconnection structure provided by the disclosure, the conductor pillar and the shielding wall pillar may be disposed in pair or in group. As a result, as shown by FIGS. 7A and 7B, a shielding wall pillar structure is disposed correspondingly to the conductor pillar structure, in which the shielding wall pillar structure includes a shielding wall pillar land 740 and a shielding wall pillar 742, a shielding wall pillar land 743, a shielding wall pillar 744, a shielding wall pillar land 745, a shielding wall pillar 746 and a shielding wall pillar land 748.

The geometric shapes of the sections of the shielding wall pillars 742, 744 and 746 may be various different geometric shapes. In the embodiment, the shapes are semi-moon shape. The concave edges of the semi-moon shapes respectively face or back to the conductor pillars 734, 754 and 764. The electrical coupling between the conductor pillars and the shielding wall pillars may shield the electrical fields of the conductor pillars distributed in the vertical direction.

The fabrication method of the interconnection structure with four conductive layers is to use the middle two layers (power layers or ground layers) serving as core plates, and the process of fabricating vias on the core plates are completed, followed by performing a lamination process with appropriate prepreg. Then, a copper foil implantation process is performed on the first and fourth layers through up-and-down against-pressing two copper foils (one is at up and the other is at down). After that, an etching process and a conductor pillar drilling or etching process are performed to complete the components of the signal trace and the via.

The Embodiment of FIGS. 8(A)-8(E)

In the embodiment of an interconnection structure provided by the disclosure, the conductor pillar and the shielding wall pillar may be disposed in pair or in group, in which in addition to a conductor pillar, the structure includes also a shielding wall pillar with a geometric shape different from that of the conductor pillar and the shielding wall pillar serves as, for example, a ground via or a power via. FIGS. 8(A)-8(E) are diagrams respectively illustrating different layouts of conductor pillars 810a-810e and several corresponding shielding wall pillars.

Figure 8:
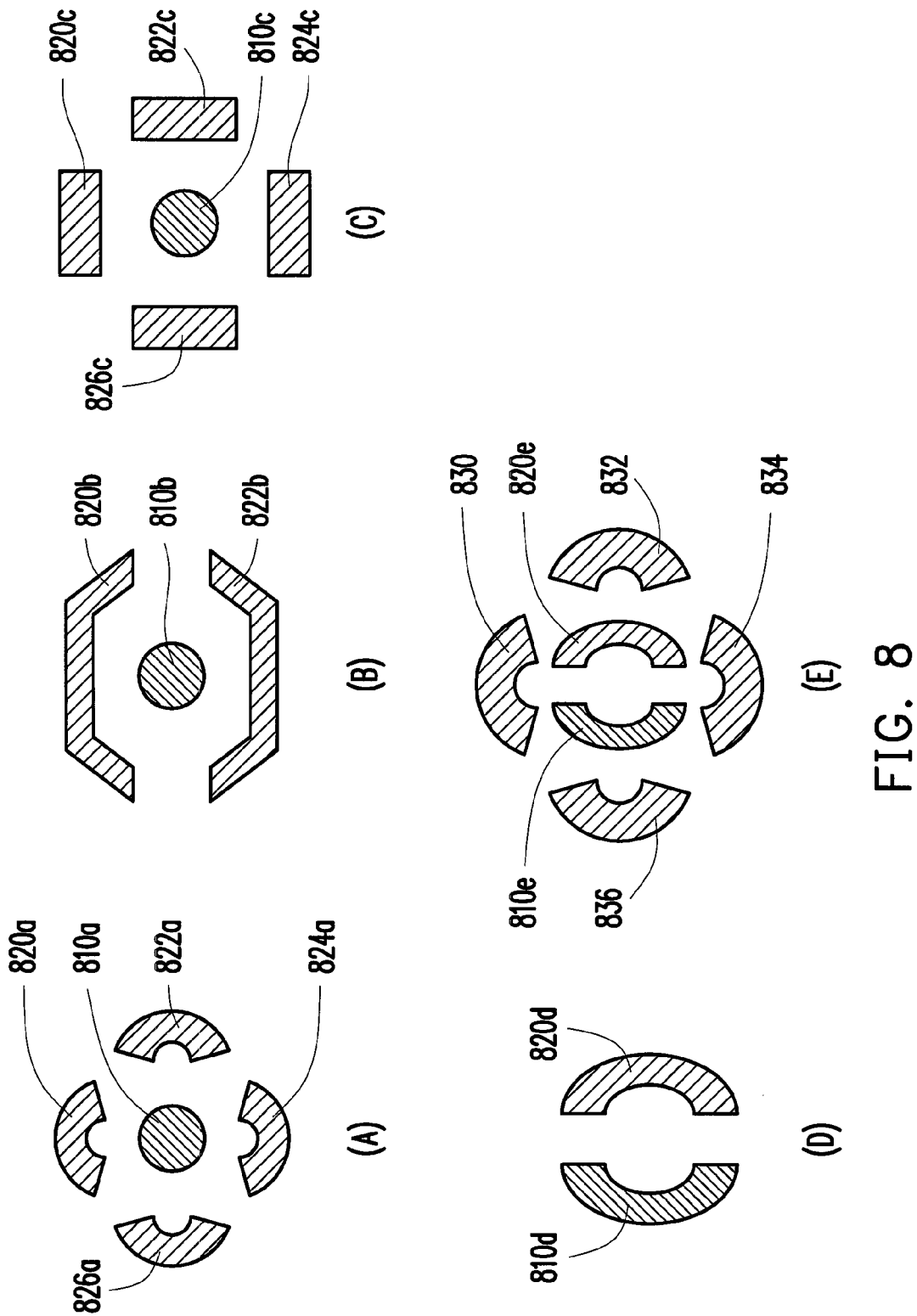
FIGS. 8(A)-8(E) are diagrams respectively illustrating different layouts of a conductor pillar and several corresponding shielding wall pillars in an interconnection structure provided by the disclosure.

As shown by FIG. 8(A), a conductor pillars goes through between the first conductive layer and the second conductive layer both substantially parallel to each other, in which the conductive layer has a circle shape section and is surrounded by a plurality of shielding wall pillars 820a, 822a, 824a and 826a all with semi-moon shape sections. The conductor pillar 810a serves as a connection with a designed or predetermined impedance and the capability of controlling impedance. If the above-mentioned conductor pillar serves as a signal via, for example, the problem related to the signal integrity on the vertical via can be solved. The shielding wall pillars 820a, 822a, 824a and 826a are electrically coupled to a surrounding area on the side wall surface of the conductor pillar 810a and the value of the surrounding area (i.e., the value of the coupling area) is greater than the area of projecting of the conductor pillar 810a onto the surfaces of the shielding wall pillars 820a, 822a, 824a and 826a so that the other direction regions opposite to the regions where the shielding wall pillars 820a, 822a, 824a and 826a face the conductor pillar 810a can be shield from the interference of the electrical field.

As shown by FIG. 8(B), a conductor pillar 810b with a circle shape section is surrounded by two shielding wall pillars 820b and 822b with section concave edges facing the conductor pillar 810b. As shown by FIG. 8(C), a conductor pillar 810c with a circle shape section is surrounded by four shielding wall pillars 820c, 822c, 824c and 826c with rectangular sections.

As shown by FIG. 8(D), there are a conductor pillar 810d and a shielding wall pillar 820 both having their respective shape similar to semi-moon, in which the concave edges thereof face each other. In FIG. 8(E), a conductor pillar 810e and a shielding wall pillar 820 both having shape similar to semi-moon are disposed against each other, and additional four shielding wall pillars 830, 832, 834 and 836 with shapes similar to semi-moon are disposed surrounding the conductor pillar 810e and the shielding wall pillar 820.

The shielding wall pillars are disposed surrounding the side wall of the above-mentioned conductor pillar and electrically coupled to at least a surrounding area on the side wall surface of the conductor pillar. The value of the surrounding area is determined by the distribution of the electrical field produced by the conductor pillar during a current is flowing. The value of the surrounding area on the side wall surface of the conductor pillar where the shielding wall pillar is electrically coupled to is just the value of the coupling area, and the coupling area must be greater than the area of projecting of the conductor pillar onto the surface of each shielding wall pillar, so that the other sides opposite to that facing the conductor pillar can be shielded from or block the interference of the electrical field.

The Embodiment of FIGS. 9A-9H

The interconnection structure provided by the disclosure includes a structure of conductor pillar and shielding wall pillar disposed in pair or in group. The fabrication method in one of a plurality of embodiments can refer to FIGS. 9A-9H, in which a silicon substrate is selected as an example where a plurality of conductor pillars and a plurality of shielding wall pillars are disposed in pair or in group so as to form an interconnection structure provided by the disclosure.

Figure 9A:
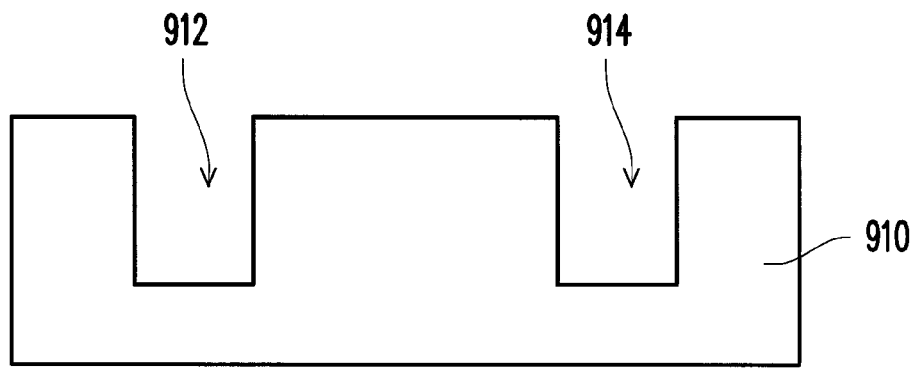
FIGS. 9A-9H are cross-sectional diagrams illustrating a method for fabricating an interconnection structure provided by the disclosure.

Referring to FIG. 9A, a silicon wafer 910 is provided. A mask process is performed on the wafer to expose the parts to be etched later. Then, an etching process is performed to form a plurality of holes, in which there are at least two holes 912 and 914 serving as a conductor pillar and a shielding wall pillar. After that, the mask is removed. Using the above-mentioned procedures, the conductor pillar and shielding wall pillar with different shapes from each other can be defined so as to achieve the via structure provided by the disclosure.

Figure 9B:
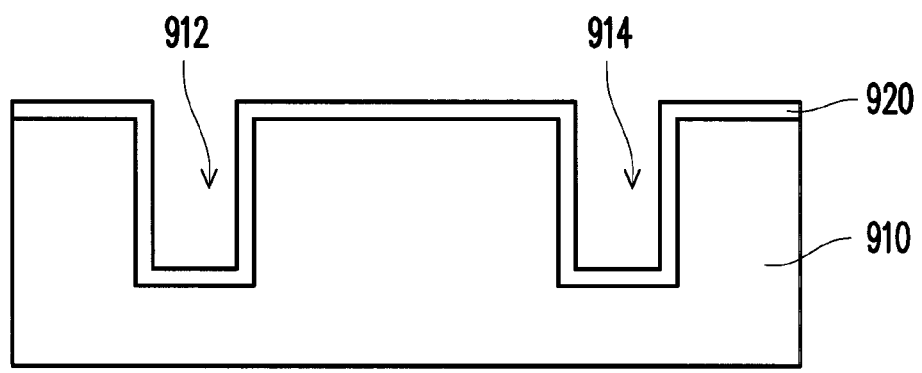

Referring to FIG. 9B, a process of implantation of insulation layer is performed by using, for example, a thermal oxidation process. The procedure includes an oxidation procedure on the silicon wafer 910 to form a $SiO_2$ layer. In another embodiment, it can also use a plasma-enhanced chemical vapor deposition (PECVD) to deposit and form, for example, the $SiO_2$ layer. After the process of implantation of insulation layer, an insulation layer 920 is formed in the holes 912 and 914.

Figure 9C:
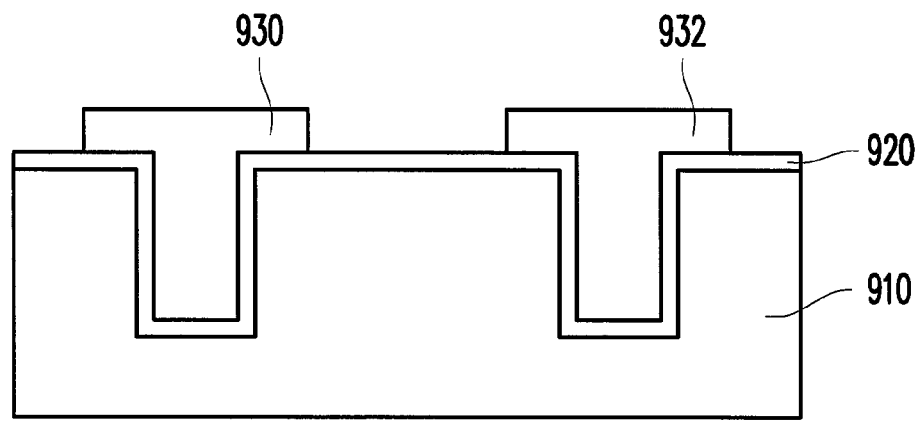

Then referring to FIG. 9c, conductors are formed in the holes 912 and 914, in which, for example, a sputtering process is used to form copper seed including Cu and Ti. Then, a plating process is used to fill up the hole 912 with metal. During the plating process, a mask process is used to expose the part to be plated later. After finishing the plating process, the mask is removed, followed by a micro-etching process to remove the thin seed metal on the front surface so as to form two via bump bodies 930 and 932.

Figure 9D:
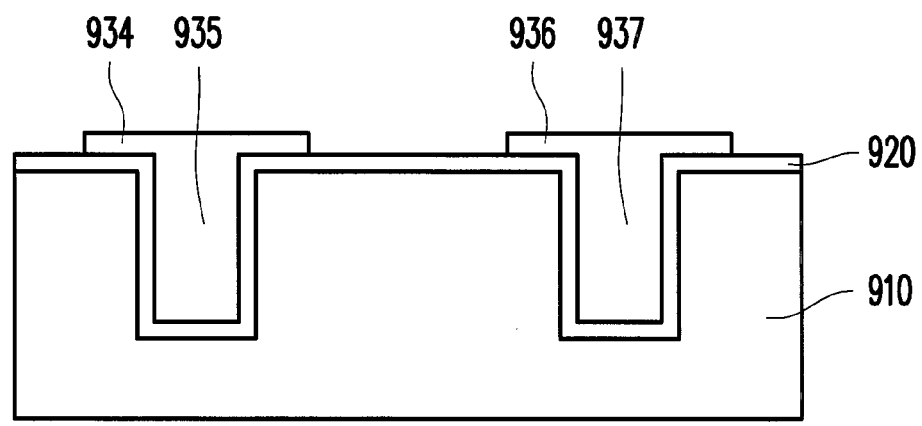

Referring to FIG. 9D, in order to obtain a flat TSV surface and a thinner surface conductor thickness, according to the real need, a chemical mechanical polishing (CMP) process is used for lapping to make the surface conductor thickness thinner.

Figure 9E:
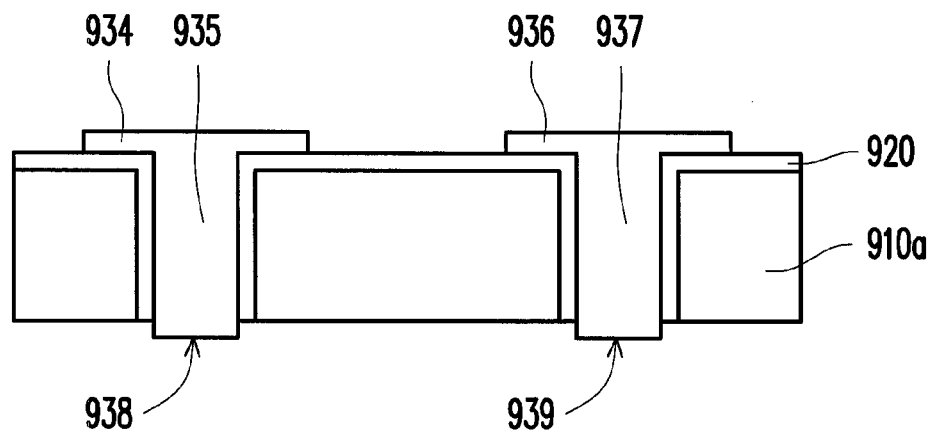

After that referring to FIG. 9E, a lapping process on the bottom back surface of the silicon wafer 910 (i.e., the other corresponding surface opposite to the formed insulation layer 920) is performed, in which, for example, a CMP process is used to expose the bottom surfaces of the conductor pillar structure and the shielding wall pillar structure of the silicon wafer 910a after lapping, for example, to expose the bottom surfaces of the conductor pillar 935 and the shielding wall pillar 937. In this way, the whole chip thickness can be reduced a lot and the remained thickness reaches, for example, 50 µm, even 25 µm or thinner.

Figure 9F:
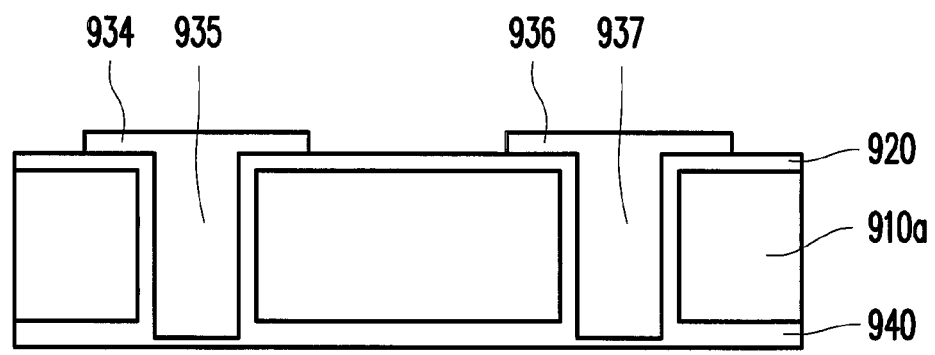
Figure 9G:
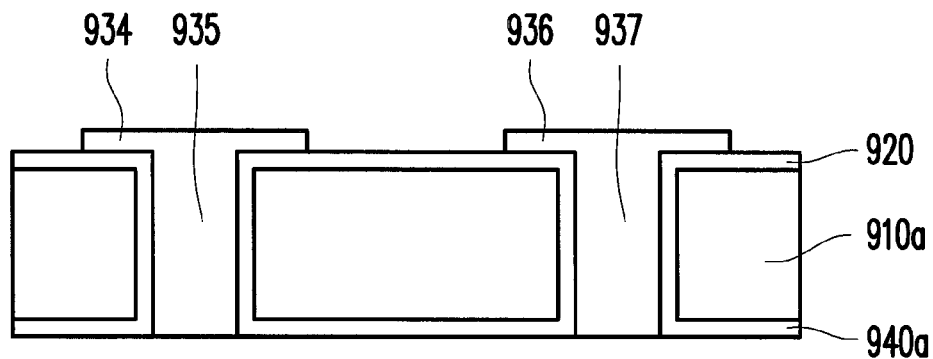

Referring to FIG. 9F, an oxidation procedure is performed to form an insulation layer 940, for example $SiO_2$ layer, on the bottom back surface of the silicon wafer 910. At the time, the original surface of the silicon wafer 910 (the surface originally forming the insulation layer 920) must be protected with a mask or other temporary carrier to prevent the originally formed pattern from affecting or damage.

Figure 9H:
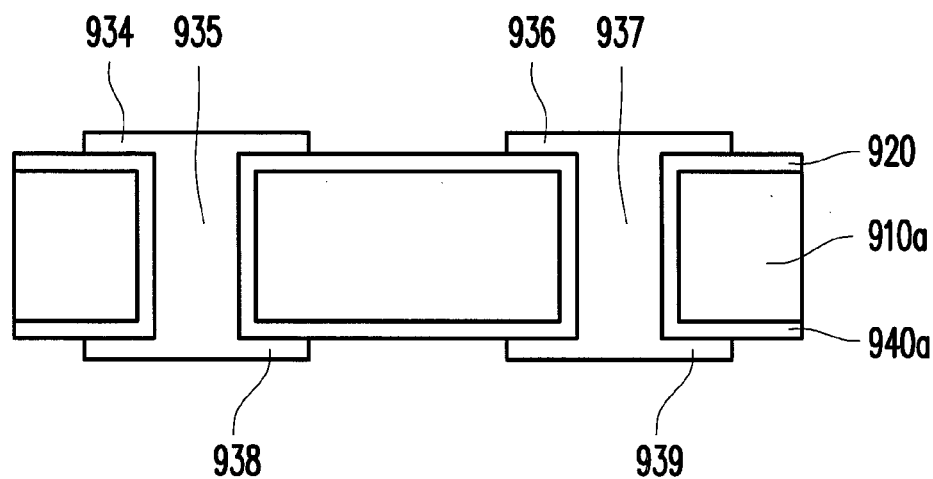

A CMP process on the bottom back surface of the silicon wafer 910a is performed and the bottoms of the conductor pillar 935 and the shielding wall pillar 937 are exposed again and the exposed portions serve as the conductor pillar land and the shielding wall pillar land for electrical connections at the other ends of the conductor pillar 935 and the shielding wall pillar 937. Then as shown by FIG. 9H, the conductor pillar land 938 and the shielding wall pillar land 939 are formed at the bottoms of the conductor pillar 935 and the shielding wall pillar 937.

Conducting the above-mentioned processes as shown by FIGS. 9A-9H, the interconnection structure provided by the disclosure can be formed, which includes a pair, a plurality of pairs or a plurality of groups of conductor pillars and shielding wall pillars.

Figure 9I:
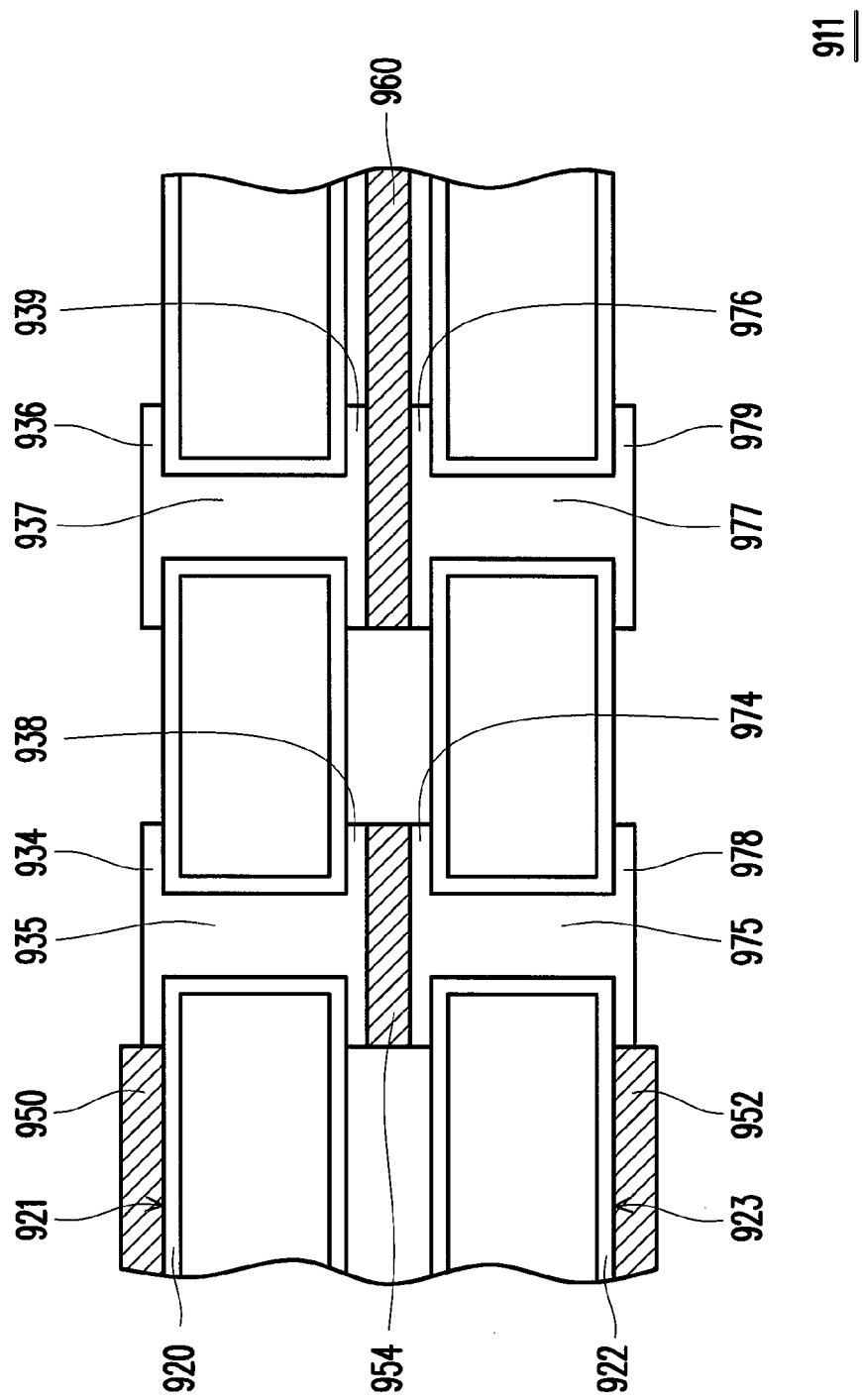
FIG. 9I is a cross-sectional diagram of an interconnection structure provided by the disclosure.

FIG. 9I illustrates a structure with plural layers of the silicon wafer, in which there is an interconnection structure provided by the disclosure according to one of the embodiments, and the parts same as that in FIGS. 9A-9H have the same marks.

In the silicon wafer 911, the interconnection structure includes a signal trace 950 formed on a surface of the insulation layer 920, while the other surface of the insulation layer 920 faces into the silicon wafer 911. The interconnection structure further includes a signal trace 952 located on one of the surfaces of the insulation layer 922, while the other surface of the insulation layer 922 faces into the silicon wafer 911. The signal trace 950 is electrically connected to the first conductor pillar structure and the signal trace 952 is electrically connected to the second conductor pillar structure. The first conductor pillar structure includes the conductor pillar 935 and the two conductor pillar lands 934 and 938 at both ends of the conductor pillar 935. The second conductor pillar structure includes the conductor pillar 975 and the two conductor pillar lands 974 and 978 at both ends of the conductor pillar 975. The first conductor pillar structure is electrically connected to the second conductor pillar structure though a conductor 954.

The above-mentioned interconnection structure provided by the disclosure includes a structure of conductor pillar and shielding wall pillar disposed in pair or in group. Hence, the first conductor pillar structure has a corresponding first shielding wall pillar structure and the second conductor pillar structure has a corresponding second shielding wall pillar structure. As shown by FIG. 9I, the first shielding wall pillar structure includes a shielding wall pillar 937 and two shielding wall pillar lands 936 and 939 at both ends thereof. The second shielding wall pillar structure includes a shielding wall pillar 977 and two shielding wall pillar lands 976 and 979 at both ends thereof. The first shielding wall pillar structure and the second shielding wall pillar structure are electrically connected to a reference conductive layer, for example, one of a power layer and a ground layer.

It will be apparent to those skilled in the art that various modifications and variations can be made to the structure of the disclosure without departing from the scope or spirit of the disclosure. In view of the foregoing, it is intended that the disclosure covers modifications and variations of this disclosure provided and they fall within the scope of the following claims and their equivalents.

What is claimed is:

1. An interconnection structure, disposed between a first conductive layer and a second conductive layer substantially parallel to each other and including a first signal trace and a second signal trace, respectively, the interconnection structure comprising:

a conductor pillar, arranged between the first conductive layer and the second conductive layer, and electrically connected to the first signal trace and the second signal trace; and a shielding wall pillar structure, disposed at a portion of an external region surrounding the conductor pillar and electrically connected to a reference conductive wire, wherein:

the shielding wall pillar structure includes at least a first area facing the conductor pillar, the first area being a continuous surface and greater than a second area formed by projecting the conductor pillar onto the shielding wall pillar structure, and the first area includes a sub-area extending along a direction parallel to the conductor pillar between an upper end coplanar with an upper surface of the first signal trace and a lower end coplanar with a lower surface of the second signal trace, the sub-area intersecting with an imaginary extension of the first signal trace and having a same width as the first signal trace.

2. The interconnection structure as claimed in claim 1, wherein:

a cross-sectional shape of the conductor pillar is a first geometric shape and a cross-sectional shape of the shielding wall pillar structure is a second geometric shape, and the first geometric shape is different from the second geometric shape.

3. The interconnection structure as claimed in claim 2, wherein the cross-sectional shape of the conductor pillar is a circle shape.

4. The interconnection structure as claimed in claim 2, wherein:
the first geometric shape is a circle shape,
the second geometric shape is a semi-moon shape, and
a concave edge of the semi-moon shape faces or backs to the conductor pillar.

5. The interconnection structure as claimed in claim 1, wherein:
the reference conductive wire is located at one of a ground layer or a power layer, and
the ground layer or the power layer is substantially parallel to at least one of the first conductive layer and the second conductive layer.

6. The interconnection structure as claimed in claim 1, wherein the reference conductive wire is:
located at the second conductive layer,
electrically isolated from the second signal trace, and
electrically connected to a ground layer or a power layer.

7. The interconnection structure as claimed in claim 1, further comprising:
a plurality of the shielding wall pillar structures,
wherein the shielding wall pillar structures surround the conductor pillar.

8. An apparatus, comprising a medium plate and the interconnection structure as claimed in claim 1, wherein the interconnection structure is disposed at the medium plate.

9. The apparatus as claimed in claim 8, wherein the medium plate includes one of a silicon structure, a glass structure, a printed circuit board structure, or a ceramic substrate.

10. An apparatus, comprising a silicon plate and the interconnection structure as claimed in claim 1, wherein the silicon plate includes:
a first insulation layer and a second insulation layer, the first conductive layer being disposed at a side of the first insulation layer, and the second conductive layer being disposed at a side of the second insulation layer;
a first through hole and a second through hole, the conductor pillar being disposed in the first through hole, and at least a portion of the shielding wall pillar structure being disposed in the second through hole;
a first insulation medium, located between a side wall of the first through hole and the conductor pillar, a cross-sectional shape of the first through hole being a first geometric shape; and
a second insulation medium, located between a side wall of the second through hole and the shielding wall pillar structure, a cross-sectional shape of the second through hole being a second geometric shape different from the first geometric shape.

11. The apparatus as claimed in claim 10, wherein the first geometric shape is circle shape.

12. The apparatus as claimed in claim 10, wherein:
the first geometric shape is circle shape,
the second geometric shape is semi-moon shape, and
a concave edge of the semi-moon shape faces or backs to the conductor pillar.

13. The interconnection structure as claimed in claim 1, wherein a horizontal cross section of the shielding wall pillar structure has a semi-annular shape.

14. An interconnection structure, disposed between a first conductive layer and a second conductive layer substantially parallel to each other, the first conductive layer including a signal trace, the interconnection structure comprising:
a conductor pillar, arranged between the first conductive layer and the second conductive layer, and electrically connected to the signal trace; and
a shielding wall pillar structure, disposed at a portion of an external region surrounding the conductor pillar, wherein:
the shielding wall pillar structure includes at least a first area facing the conductor pillar, the first area being a continuous surface and greater than a second area formed by projecting the conductor pillar onto the shielding wall pillar structure, and
the first area includes a sub-area extending along a direction parallel to the conductor pillar between an upper end coplanar with an upper surface of the first conductive layer and a lower end coplanar with a lower surface of the second conductive layer, the sub-area intersecting with an imaginary extension of the signal trace and having a same width as the signal trace.

15. The interconnection structure as claimed in claim 14, wherein:
a cross-sectional shape of the conductor pillar is a first geometric shape and a cross-sectional shape of the shielding wall pillar structure is a second geometric shape, and
the first geometric shape is different from the second geometric shape.

16. The interconnection structure as claimed in claim 15, wherein the cross-sectional shape of the conductor pillar is a circle shape.

17. The interconnection structure as claimed in claim 15, wherein:
the first geometric shape is a circle shape,
the second geometric shape is a semi-moon shape, and
a concave edge of the semi-moon shape faces frontward or backward to the conductor pillar.

18. The interconnection structure as claimed in claim 14, further comprising:
a plurality of shielding wall pillar structures,
wherein the shielding wall pillar structures surround the conductor pillar.

19. A circuit structure, comprising:
a first conductive layer, including a first signal trace;
a second conductive layer, including a second signal trace, the second conductive layer being substantially parallel to the first conductive layer;
a reference conductive wire, located between the first conductive layer and the second conductive layer;
a conductor pillar, arranged between the first conductive layer and the second conductive layer, the conductor pillar being electrically connected to the first signal trace and the second signal trace and being electrically isolated from the reference conductive wire; and
a shielding wall pillar structure, disposed at a portion of an external region surrounding the conductor pillar and electrically connected to the reference conductive wire, wherein:
the shielding wall pillar structure includes at least a first area facing the conductor pillar, the first area being a continuous surface and greater than a second area formed by projecting the conductor pillar onto the shielding wall pillar structure, and
the first area includes a sub-area extending along a direction parallel to the conductor pillar between an upper end coplanar with an upper surface of the first signal trace and a lower end coplanar with a lower surface of the second signal trace, the sub-area intersecting with an imaginary extension of the first signal trace and having a same width as the first signal trace.

20. The circuit structure as claimed in claim 19, wherein:
a cross-sectional shape of the conductor pillar is a first geometric shape and a cross-sectional shape of the shielding wall pillar structure is a second geometric shape, and
the first geometric shape is different from the second geometric shape.

21. The circuit structure as claimed in claim 20, wherein the cross-sectional shape of the conductor pillar is a circle shape.

22. The circuit structure as claimed in claim 20, wherein:
the first geometric shape is a circle shape,
the second geometric shape is a semi-moon shape, and
a concave edge of the semi-moon shape faces frontward or backward to the conductor pillar.

23. The circuit structure as claimed in claim 19, wherein the reference conductive wire is located at a ground layer or a power layer, and the ground layer or the power layer is disposed between the first conductive layer and the second conductive layer.

24. The circuit structure as claimed in claim 19, wherein the reference conductive wire is:
located at the second conductive layer,
electrically isolated from the second signal trace, and
electrically connected to one of a ground level or a power level.

25. The circuit structure as claimed in claim 19, further comprising a plurality of the shielding wall pillar structures,
wherein the shielding wall pillar structures surround the conductor pillar.

* * * * *